US012412006B2

(12) United States Patent
Chen et al.

(10) Patent No.: US 12,412,006 B2
(45) Date of Patent: Sep. 9, 2025

(54) LARGE-SCALE DENUDATION DEPTH THEMATIC MAPPING METHOD

(71) Applicant: Institute Of Geology, Chinese Academy Of Geological Sciences, Beijing (CN)

(72) Inventors: Wen Chen, Beijing (CN); Jingbo Sun, Beijing (CN); Bin Zhang, Beijing (CN); Shuangfeng Zhao, Beijing (CN); Pengfei Tian, Beijing (CN); Ruxin Ding, Beijing (CN); Ze Shen, Beijing (CN); Wen Zhang, Beijing (CN); Zhi Li, Beijing (CN); Qiuyi Du, Beijing (CN)

(73) Assignee: INSTITUTE OF GEOLOGY, CHINESE ACADEMY OF GEOLOGICAL SCIENCES, Beijing (CN)

( * ) Notice: Subject to any disclaimer, the term of this patent is extended or adjusted under 35 U.S.C. 154(b) by 0 days.

(21) Appl. No.: 18/808,249

(22) Filed: Aug. 19, 2024

(65) Prior Publication Data

US 2025/0086352 A1 Mar. 13, 2025

(30) Foreign Application Priority Data

Sep. 13, 2023 (CN) .......................... 202311174354.3

(51) Int. Cl.
*G06F 30/20* (2020.01)
(52) U.S. Cl.
CPC .................................. *G06F 30/20* (2020.01)

(58) Field of Classification Search
CPC ...................................................... G06F 30/20
See application file for complete search history.

(56) References Cited

U.S. PATENT DOCUMENTS

2011/0264430 A1* 10/2011 Tapscott ................. G01V 99/00
703/10

OTHER PUBLICATIONS

CN-111753406-A, English Translation (Year: 2020).*
Ruxin Ding, Low-T Thermo: a new program for arbitrarily combining low-T thermochronological data to model thermal history, Low-T Lab, Shanghai 201101, China (Year: 2017).*

(Continued)

*Primary Examiner* — Michael J Dalbo
(74) *Attorney, Agent, or Firm* — Crowell & Moring LLP; John C. Freeman

(57) ABSTRACT

A large-scale denudation depth thematic mapping method, which includes: creating a rule for arranging field work point and field work route, a sampling rule, a field observation and recording rule and a mineral processing rule of a research area. Analyzing a target mineral selected at each field work point by using a thermochronology research method and inputting analysis data into a Low-T Thermo software to perform thermal evolution history modeling and denudation depth calculation, so as to obtain a denudation depth at each of the field work points. Drawing a denudation depth isopleth map of the research area according to the denudation depth at each of the field work points; and setting a large-scale standard regional geological map of the research area as a base map. Superimposing the base map and the denudation depth isopleth map to obtain a denudation depth map of the research area.

8 Claims, 13 Drawing Sheets

(56) References Cited

OTHER PUBLICATIONS

The thermal history and uplift process of the Ouxidaban pluton in the South Tianshan orogen: Evidence from Ar-Ar and (U-Th)/ HeZhang, Sci China Earth Sci February (2016) vol. 59 No. 2 (Year: 2016).*

Long, Ar-Ar muscovite dating as a constraint on sediment provenance and erosion processes in the Red and Yangtze River systems, SE Asia, Earth and Planetary Science Letters 295 (2010) 379-389 (Year: 2010).*

Lifeng, Denudation rates of granitic regolith along climatic gradient in Eastern China, Geomorphology 390 (2021) 107872 (Year: 2021).*

* cited by examiner

| Input | |
|---|---|
| Ts(at sea level) | Lap |
| 20 (°C) | 6 (°C/km) |
| Base Temperature | Base depth |
| 600 (°C) | 25 (km) |
| Wave length | Thermal diffusivity |
| 400 (km) | 32 (km^2/Ma) |
| Young's modulus | Poisson's ratio |
| 100 (GPa) | 0.25 |
| Mantle density | Crust density |
| 3300 (kg/m^3) | 2700 (kg/m^3) |
| Effective elastic thickness | Gravitational acceleration |
| 15 (km) | 9.8 (m/s^2) |
| Time | Initial delta elevation |
| 30 (Ma) | 0.1 (km) |

LARGE-SCALE DENUDATION DEPTH THEMATIC MAPPING METHOD

CROSS-REFERENCE TO RELATED APPLICATION

This patent application claims the benefit and priority of Chinese Patent Application No. 202311174354.3 filed with the China National Intellectual Property Administration on Sep. 13, 2023, the disclosure of which is incorporated by reference herein in its entirety as part of the present application.

BACKGROUND OF INVENTION

Technical Field

The present disclosure relates to the field of denudation depth mapping, in particular to a large-scale denudation depth thematic mapping method.

Related Art

After the formation of a geological body, it is difficult to remain motionless in the long geological history of later period, and usually movement occurs due to tectonic activities. There are two ways of movement: horizontal movement and vertical movement. The horizontal movement of the geological body is more concerned in the field of the geotectonic research, while the vertical movement of the geological body is more concerned in the regional geological research and the mineral deposits research. Intrusive rocks, metamorphic rocks and metal deposits are usually formed in depth of several kilometers to dozens of kilometers. Due to uplift of the geological body resulted from the tectonic action in the later period, the geological body is outcropped by the denudation and unroofing action. The research of the process of uplift, denudation and outcropping of the geological body has the dual significance in revealing the regional geological evolution history (geotectonics) and researching the regularity of ore formation to promote mineral exploration. (1) Regional geological significance. As the uplift of the geological body is usually resulted from the tectonic activity, the research of the process of uplift, denudation and outcropping of the geological body can invert the nature, scale and action process of tectonic events, thus giving qualitative and quantitative constraints to the regional geological evolution process. (2) The significance of the research on the formation, preservation and change of mineral deposit. The mineral deposits research should not only pay attention to the origin and formation of the mineral deposit, but also take into account the preservation and change of the mineral deposit after its formation. The genetic types, occurrence characteristics, tectonic activities, paleoclimate and paleoenvironment, uplift and denudation of different deposits all constitute the influencing factors of the preservation and change of the mineral deposit. In generally, the change of mineral deposits is twofold: firstly, the change of mineral deposit and the ore body itself; secondly, the change of the environment and spatial position wherein the mineral deposit is located. The preservation of mineral deposit mainly depends on weathering and denudation history of overlying rocks. The formation of mineral deposit is closely related to the preservation conditions of their tectonic environment. By quantitatively calculating the uplift and denudation amount of the mineral deposit and the regional geological bodies in the metallogenic belt, the preservation and change of the mineral deposit in the metallogenic belt can be comprehensively evaluated and the regional mineral exploration can be guided.

From the above, it can be seen that it is not only of theoretical significance for the research of regional geological evolution, but also of practical value for regional prospecting breakthrough to carry out regional denudation depth mapping and depict finely the change of the denudation depth in different parts of the region.

In addition, if the denudation depth mapping can be carried out in the whole country or even in the whole world on a scale of 1:50,000, 1:200,000, or 1:250,000 regional geological mapping, the vertical evolution process of the Earth surface will be comprehensively grasped from a macro perspective. The deep tectonic evolution history of the Earth can be inverted inward, and the constraints of terrain and geomorphological changes on the changes of hydrosphere and atmosphere can be discussed outward, providing a new approach for the research of coordinated evolution of the multiple layers of the Earth. Thermochronology geological mapping includes a regional uplift rate map, a regional denudation rate map and a regional denudation depth (denudation amount) map. Internationally, such mapping has a large range, usually an island or even a whole country, so that all the formed maps are small-scale, and the actual operation is relatively easy. In terms of practicality, it is only for observing the general trend of change in a large area and has no more practical values. There are many achievements in thermochronology research in China. However, there are few researches about thermochronology mapping, and only sporadic thermochronology maps of mining areas have been published, all of which are small-scale, irregular and non-normative.

At present, large-scale (such as 1:50,000 and 1:200,000) denudation depth mapping equipped with standardized geological base map has not been carried out either domestically or internationally. Therefore, it is very urgent to explore a method of denudation depth mapping, which is in large-scale (such as 1:50,000, 1:200,000 and 1:250,000) and equipped with standardized geological base map, and establish the technical specifications for the denudation depth mapping operation by using the thermochronology method standardized geological base map, so as to lay a foundation for conducting large-scale (such as 1:50,000, 1:200,000 and 1:250,000) denudation depth mapping equipped with standardized geological base map in China and even the whole world.

SUMMARY

A purpose of the present disclosure is to provide a large-scale denudation depth thematic mapping method, which can achieve large-scale (such as 1:50,000 and 1:200,000) denudation depth mapping that equipped with standardized geological base map, and the obtained data in the denudation depth mapping is more accurate and more in line with the real situation, so as to comprehensively evaluate the preservation and change state of mineral deposit in the metallogenic belt more truly and accurately and guide regional mineral exploration.

In order to achieve the above objectives, the present disclosure provides the following scheme.

A large-scale denudation depth thematic mapping method includes:
    creating a rule for arranging field work point and field work route in a research area and creating a sampling rule for sampling at the field work point;

creating a field observation and recording rule suitable for thermochronology research and formulating a mineral processing rule;

analyzing target mineral selected at each of the field work points by using a thermochronology research method to obtain basic analysis data;

inputting the basic analysis data into an improved Low-Temperature Thermochronology (Low-T Thermo) software to perform thermal evolution history modeling and denudation depth calculation, so as to obtain a denudation depth of each of the field work points; where the improved Low-T Thermo software is obtained by incorporating Ar—Ar dating results of potassium feldspar, plagioclase and amphibole as modeling parameters on the basis of a traditional Low-T Thermo software; and drawing a denudation depth isopleth map of the research area according to the denudation depth at each of the field work points; and setting a 1:50000 or 1:200000 standard regional geological map of the research area as a base map, superimposing the base map and the denudation depth isopleth map to obtain a denudation depth map of the research area.

In an embodiment, the creating a rule for arranging field work point and field work route in a research area includes:

setting the field work point according to a thermochronology analysis precision, lithologic distribution characteristics, point representativeness and uniformity; and setting the work route according to distribution of the field work points.

In an embodiment, the creating a sampling rule for sampling at the field work point includes:

for a "stock-like rock mass" with an outcropped area of less than 5 km² in intrusive rocks, collecting one thermochronology research sample according to surface outcrop situation and sampling convenience;

for a "plane rock mass" with an elevation range less than 400 meters in an outcropped range of the intrusive rocks, when the "plane rock mass" is a convergent rock mass, collecting one or two thermochronology research samples, where a sampling position is a center of the rock mass or the highest point of the rock mass outcropping, an edge of the rock mass or the lowest point of the rock mass outcropping; when the "plane rock mass" is a strip rock mass, collecting one to three thermochronology research samples, and the sampling positions are the center and both ends of the rock mass; the convergent rock mass refers to round, oval and square rock mass, etc.;

for a "three-dimensional rock mass" in the intrusive rocks, collecting a series of thermochronology research samples according to an elevation difference of 300 to 400 meters, and increasing a sampling density at both ends of the rock mass; where the elevation range of the "three-dimensional rock mass" within an outcropped range of the rock mass is more than 400 meters;

for a fault zone, setting control points at the center and both ends of the fault zone along the fault zone, and collecting thermochronology research samples at both sides of the fault zone of the control points, respectively;

for a shear zone, setting three control points at the center and both ends of the shear zone along the shear zone, and collecting at least one thermochronology research sample on each shear zone;

for metamorphic strata, collecting a thermochronology research sample according to the outcropping of metamorphic strata and in accordance with an intrusive rock sampling rule;

for sandstones and epimetamorphic rocks in sedimentary strata, collecting a lithologic control sample, or collecting thermochronology research sample according to lithology and outcropping situation and with reference to intrusive rock sampling rule; and for continuous thermochronology sections, selecting one or two sections with an elevation difference larger than 1000 m inside a map sheet range, and collecting thermochronology research samples according to a predetermined elevation difference to form thermochronology sections.

In an embodiment, the creating a field observation and recording rule suitable for thermochronology research includes:

dividing the field work points into geological control points and geological observation points, and setting a description rule for the geological control points and the geological observation points; and setting format and content of a field record book.

In an embodiment, formulating a mineral processing rule includes:

using an uncontaminated equipment and strictly preventing cross-contamination of samples when crushing target sample;

when sorting monominerals of zircon, apatite and sphene, ensuring integrity of a crystal form, crushing the sample and passing crushed sample through sieve multiple times, where a heating and baking temperature of the sample does not exceed 45° C., and more than 1000 grains are selected for each monomineral; and when sorting silicate minerals, strictly prohibiting organic contamination during the sorting process, wherein particle size is 60 to 80 meshes, purity is above 99%, and each monomineral sorted weights above 3 grams; and the silicate minerals include hornblende, biotite, potassium feldspar, plagioclase and sanidine.

In an embodiment, the analyzing target minerals selected at each of the field work points by using a thermochronology research method to obtain basic analysis data includes:

performing zircon, apatite (U—Th)/He dating, apatite fission track dating, potassium-containing silicate mineral Ar—Ar dating, zircon U—Pb dating and whole rock composition analysis on the target mineral selected at the field work point to obtain the basic analysis data; where the basic analysis data includes thermal chronological analysis data and composition analysis data of the target mineral at each of the field work points.

In an embodiment, the method includes: inputting the basic analysis data at each of the field work points is input into an improved Low-T Thermo software to perform thermal evolution history modeling and denudation depth calculation, so as to obtain the denudation depth at each of the field work points.

In an embodiment, the drawing a denudation depth isopleth map of the research area according to the denudation depth at each of the field work points; and setting a 1:50,000 or 1:200,000 standard regional geological map of the research area as a base map, superimposing the base map and the denudation depth isopleth map to obtain a denudation depth map of the research area, includes:

creating a plain text (TXT) document based on sample location information and the denudation depth of each of the field work points;

selecting "discrete data gridding" in Map Geographical Information System (MAPGIS) software to process the TXT document;

drawing the denudation depth isopleth map by using a "plane isopleth drawing" function in the MAPGIS software according to the processed TXT document;

vectorizing the 1:50,000 or 1:200,000 standard regional geological map by using an "image analysis" function in the "image processing" in the MAPGIS software, and setting the vectorized standard geological map as the base map; and importing the denudation depth isopleth map into a corresponding area of the base map to obtain the denudation depth map.

According to the specific embodiment provided by the present disclosure, the present disclosure provides the following technical effects.

A large-scale denudation depth thematic mapping method according to the present disclosure includes: creating the rule for arranging field work point and field work route in the research area, the rule for sampling at the field work point, the field observation and recording rule and mineral processing rule; analyzing target minerals selected at each of the field work points by using thermochronology research methods to obtain basic analysis data; inputting the basic analysis data into an improved Low-T Thermo software to perform thermal evolution history modeling and denudation depth calculation, so as to obtain the denudation depth at each of the field work points; drawing a denudation depth isopleth map of the research area according to the denudation depth at each of the field work points; and setting the 1:50,000 or 1:200,000 standard regional geological map of the research area as a base map, superimposing the base map and the denudation depth isopleth map to obtain a denudation depth map of the research area. The method can realize large-scale denudation depth mapping of the geological body, such as 1:50,000 and 1:200,000, which equipped with standardized geological base map. The obtained data in the denudation depth map is more accurate and more in line with the real situation, so as to comprehensively evaluate the preservation and change state of mineral deposit in the metallogenic belt more truly and accurately and guide regional mineral exploration.

BRIEF DESCRIPTION OF THE DRAWINGS

In order to explain the embodiments of the present disclosure or the technical schemes in the prior art more clearly, the drawings that need to be used in the embodiments will be briefly introduced. Obviously, the drawings in the following description are only some embodiments of the present disclosure. For those skilled in the art, other drawings can be obtained according to these drawings without creative labor.

FIG. 2 is a schematic diagram of a thermal history forward modeling window according to an embodiment of the present disclosure.

FIG. 4 is a schematic diagram of chronology data input window for thermal history modeling according to an embodiment of the present disclosure.

FIG. 7 is a schematic diagram of a thermal history inversion modeling window according to an embodiment of the present disclosure.

FIG. 11 is a schematic diagram of a two-dimensional denudation calculation parameter input window according to an embodiment of the present disclosure.

DETAILED DESCRIPTION OF THE EMBODIMENTS

The technical schemes in the embodiments of the present disclosure will be clearly and completely described with reference to the drawings in the embodiments of the present disclosure hereinafter. Obviously, the described embodiments are only some embodiments of the present disclosure, rather than all of the embodiments. Based on the embodiment of the present disclosure, all other embodiments obtained by those skilled in the art without creative labor fall within the scope of protection of the present disclosure.

There are many methods to research the denudation depth (denudation amount) of the geological body, among which the thermochronology method is relatively effective and can give more accurate quantitative results. "Thermochronology", also known as "Isotope Thermochronology", is a comprehensive new discipline developed by combining traditional isotope chronology with other disciplines. The thermochronology method can provide comprehensive information such as time, temperature and spatial position, so as to define finely the formation of the geological body, the thermal evolution process and the spatial position change process experienced in the later period. The basic principle of the thermochronology method is to use the radioactive decay principle of isotopes and the difference of closure temperatures of different isotope systems to perform dating analysis on minerals, and to research the thermal evolution process experienced by the geological body by interpreting time and temperature information contained therein, such as the mountain orogeny process, the rock mass uplift and cooling history, the uplift, outcropping and denudation history, the sedimentary basin thermal evolution history, etc.

The core concept of the thermochronology method is the concept of the closure temperature and cooling age. The important pillar means are dating techniques, such as (U—Th)/He, fission track (FT), Ar—Ar, U—Pb, and computer modeling techniques of thermal evolution history.

The purpose of the present disclosure is to provide a large-scale denudation depth thematic mapping method, which can achieve large-scale (such as 1:50,000 and 1:200,000) denudation depth mapping equipped with standardized geological base map.

In order to make the above objects, features and advantages of the present disclosure more obvious and understandable, the present disclosure will be explained in further detail with reference to the drawings and detailed description hereinafter.

Embodiment

Figure 1:
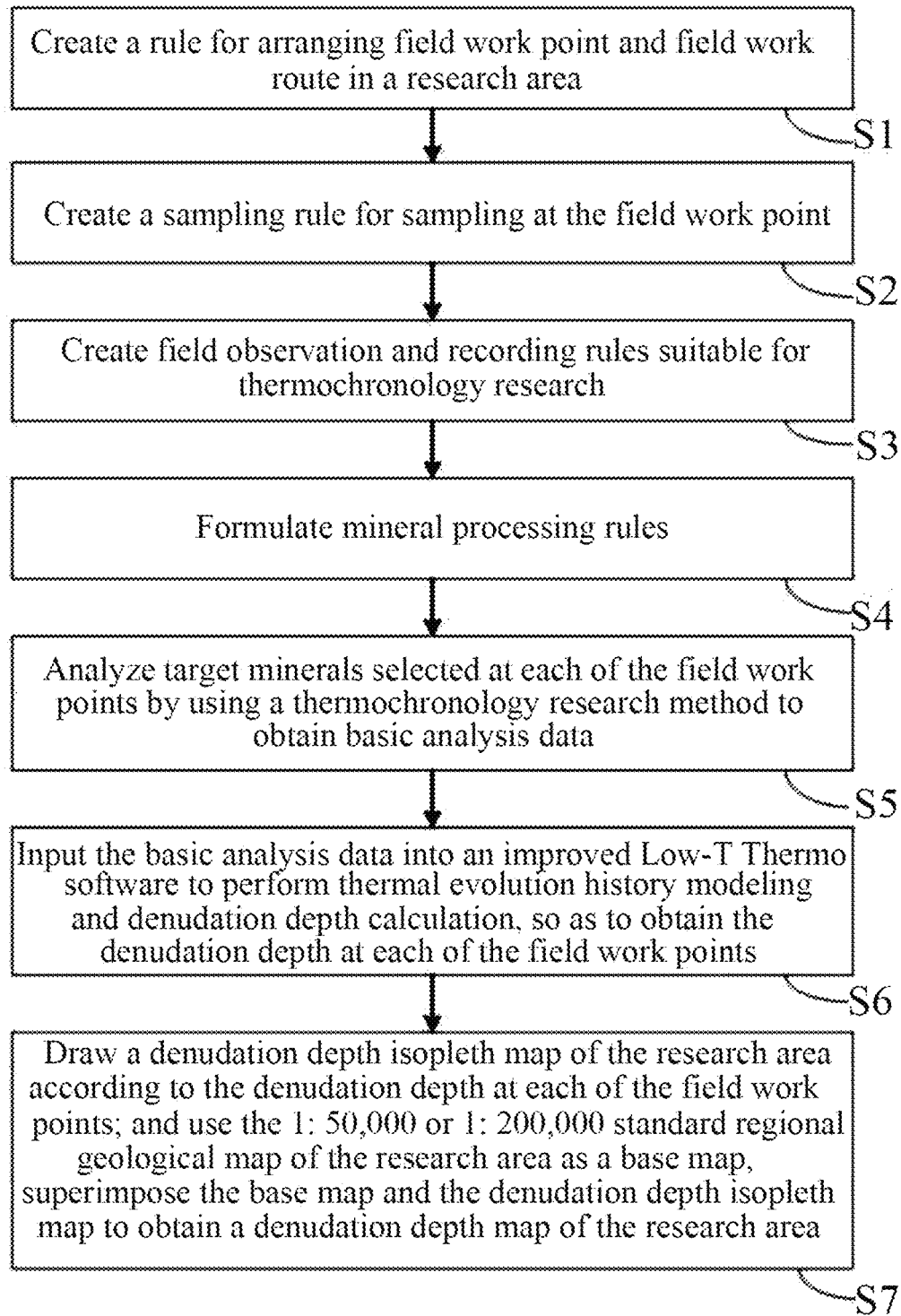
FIG. 1 is a flow chart of a large-scale denudation depth thematic mapping method according to an embodiment of the present disclosure.

As shown in FIG. 1, a large-scale denudation depth thematic mapping method according to the embodiment of the present disclosure, includes:

Step S1: a rule for arranging field work point and field work route in a research area is created.

Scheme Design and Work Preparation:

1. The research work area, i.e., mapping area, is selected.
2. After selecting the mapping area, the previous work results related to this area and its adjacent areas are comprehensively collected, including but not limited to: regional geological survey reports, thematic research reports, mining area geological survey reports, and scientific research papers and other literature, etc. By comprehensively analyzing and collating results obtained from the existing data, geotectonic position, regional geological structural characteristics, regional geological evolution history, and distribution range, type and occurrence of a key geological body such as intrusive rocks, etc. are learned about.
3. The working base map is prepared. The standard regional geological maps with a corresponding scale (1:50,000 or 1:200,000 or 1:250,000) that can cover the whole mapping area are prepared, and are integrated into the digital geological mapping system after electronization. As the work objective is to carry out denudation depth (denudation amount) thematic mapping, the thematic mapping may be based on previous regional geological survey work, and in the premise that the correctness of the previous regional geological maps with a corresponding scale (1:50,000 or 1:200,000 or 1:250,000) will be acknowledged. These standard geological maps will have two uses: (1) The maps will be used as hand-held geological maps (working maps) during field work, and will be used as the basis for field geological survey, point and route arranging, etc. (2) The maps will be used as base maps when the final denudation depth map is formed.
4. The topographic map is prepared (not necessary). According to the scale of the denudation depth map drawn in the plan, a topographic map with a corresponding scale is prepared. There are two sources of topographic maps: (1) purchasing; (2) making. The DEM electronic topographic map of the research area is collected and downloaded, data are imported into Global Mapper to create contour lines, and then converted and output in a vector format as Mapgis files, so as to obtain topographic maps with contour lines, which are then used to create field work base maps.
5. Field tools are prepared: traditional tools such as a geological hammer, a compass and a magnifier; a camera; a GPS, a Personal Digital Assistant (PDA); a notebook computer; sample bags (sample bags of different specifications, which are used to carry hand specimens, chemical analysis samples, bulk samples into), etc.

Specific rules are set for field work points and field work routes arranging.

In order to carry out field work in the selected mapping research work area, field work points and field work routes must be set first. That is, point and route arranging should be carried out first, so as to carry out field work according to the arranged points and routes. Because there was no ready-made field work point and field work route arranging rules for large-scale denudation depth mapping before, the rule for arranging field work point and field work route is established for denudation depth mapping through exploration, practice and innovative research.

The biggest difference between thematic mapping and traditional regional geological mapping is that the field research point arrangement and route selection do not need to follow grid rules of fixed values, but the field investigation route and the observation research point should be selected according to research purpose in conjunction with the actual regional geological situation. For thermochronology research such as denudation depth measurement, as the related "events" are linked and consistent in a certain area, it is not necessary to emphasize the compulsion of the investigation routes and the density of the field observation research points, but special attention needs to be paid to the distribution and representativeness of points, which are distributed in different parts of the map (center and four corners). The main consideration of thermochronology research and the route and point arrangement of thematic mapping is representativeness, followed by the uniformity of point distribution, and finally the density of points.

Field work points are divided into geological control points and observation (research) points. The number of points can be as many as possible, but is much less than that required by regional geological survey mapping. According to the current analysis precision of low-temperature thermochronology, 15 to 20 effective thermochronology data points can meet requirements of a standard map in the range of 1:50,000 when the map is finally drawn completely, which correspond to more than 40 field observation (research) points; and 25 to 30 effective thermochronology data points can meet the requirements of a standard range map of 1:200,000 or 1:250,000 when the map is finally drawn completely, which correspond to more than 60 field observation (research) points.

There is no fixed requirement for the number of routes and the design of field geological survey routes, and the basis for designing routes is the arranged points.

In a word, the principle of field work route and point arrangement for denudation depth mapping is as follows: setting the field work points by comprehensively considering the thermochronology analysis precision, lithologic distribution, point representativeness and uniformity; and setting field work routes according to the distribution of the points.

Step S2: a sampling rule for sampling at the field work point is created.

In order to carry out the denudation depth mapping, it is necessary to obtain the denudation amount by analyzing geological samples, and the relevant samples may be collected in the field as the analysis and research objects of thermochronology. Compared with regional geological mapping and regional geochemical survey mapping, denudation depth mapping is very special. Sampling rules of various existing mapping methods are no longer applicable. Through exploration, research and practice, the sampling rule of large-scale denudation depth mapping are established. First, the correctness of basic research results on lithology, lithofacies, strata and structure in 1:50,000, 1:200,000 or 1:250,000 regional geological maps are acknowledged. On this basis, the corresponding sampling rules are formulated for different geological units.

(A) Sampling Rules of Intrusive Rocks

1. In principle, each rock mass is provided with sample control.

2. For each involved lithology, a set of composition research samples, for example 5 to 10 samples (specific number is determined according to the importance of the rock mass), and 200 to 500 g per sample, are collected. If there are multiple outcrops in this set of lithology, the composition research samples are collected at each outcrop, with a total of 5 to 10 samples.

3. For a small rock mass (stock) with an outcropped area of less than 5 km$^2$, one thermochronology sample (except for those with steep outcropping which will be processed specially) is collected according to surface outcrop situations and sampling convenience.

4. Sampling rules of a "plane rock mass": for a planar outcropped rock mass (the elevation range within the outcropped range is less than 400 meters), different sampling rules are used according to the shape: (1) a convergent rock mass (the rock mass is round, oval, square, etc.) is controlled by one or two thermochronology samples, and the sampling position is a center of the rock mass (or the highest point of the rock mass outcropping) and an edge of the rock mass (or the lowest point of the rock mass outcropping); (2) a strip rock mass is controlled by one to three thermochronology samples, and the sampling positions are at the center and both ends of the rock mass.

5. Sampling rules of a "three-dimensional rock mass": for the three-dimensional outcropped rock mass (the elevation range within the outcropped range is more than 400 meters), in principle, a series of thermochronology research samples are collected according to the elevation difference of 300 to 400 meters, and the sampling density can be appropriately increased at both ends of the rock mass.

(B) Sampling Rules of a Fault Zone

For important fault zones in the region (penetrating through the region, or important structural boundaries, or differences in rock lithology ages on both sides), control points are set at the center and both ends along the fault zone, and thermochronology research samples are collected at both sides of fracture at the control point, respectively. The collection of such samples can be considered comprehensively together with the collection of intrusive rocks and metamorphic rocks.

(C) Sampling Rules of a Shear Zone

Three control points are set at the center and both ends (or both sides) along the shear zone, and at least one thermochronology research sample is collected on each shear zone, so as to collect strongly deformed rock samples.

(D) Sampling Rules of Metamorphic Strata

For metamorphic strata, such as Proterozoic old basement rocks and other metamorphic rocks, thermochronology research samples are collected according to the outcropping of metamorphic strata and with reference to the intrusive rock sampling rules.

(E) Sampling Rules of Sedimentary Strata

Generally, only lithologic control samples are collected for sandstones and epimetamorphic rocks in sedimentary strata. If necessary, thermochronology research samples are collected according to lithology and outcropping situations and with reference to intrusive rock sampling rules.

(F) Sampling Rules of Continuous Thermochronology Sections

One or two sections with large elevation difference are selected in the map, and thermochronology research samples are collected according to a certain elevation difference (300 to 400 meters) to make thermochronology sections. It is noted that the sampling density can be appropriately increased at a low elevation end and a high elevation end of the section.

(G) Suggestions on the Sampling Amount of Various Types of Rock Samples [Note: For Important Samples, the Sampling Amount should be Increased Appropriately or Even Doubled]

1. Intrusive rocks: about 5 kg; 2. basic rocks: >20 kg; 3. Proterozoic metamorphic rocks (gneiss, amphibolite, etc.): 5 to 10 kg; 4. other metamorphic rocks: as appropriate; 5. sandstone: 5 to 10 kg.

Step S3: field observation and recording rules suitable for thermochronology research are created.

Field observation and recording is one of the basic work contents of denudation depth thematic mapping. Based on recording contents of regional geological survey, in combination with special requirements of denudation depth mapping and thermochronology research, following field recording rules are explored, researched, formulated and used.

Classification and description rule of geological observation point, and the record format and content of a field book are as follows.

Geological observation points are divided into general geological control points and observation (research) points.

1. Geological control points are the points on the general normal geological observation route, whose observation content is relatively general, which can be described relatively simply. The geological control points have the function of assisting memory and prologue function leading to a drama. Only hand specimen, or even no sample is usually collected at the geological control points.

2. Observation (research) points are essence of describing field geological phenomena, most of which are analysis and testing sampling points.

Important geological phenomena discovered, such as geological boundary, geological mapping unit boundary, unconformity, and intrusive contact boundary; outcropping of key top (bottom) structures, etc.; typical geological phenomena, such as a typical fold structure, a ductile shear zone, a detachment surface, etc.; important primary structures, secondary structures and their structural indicator elements; special geological boundaries, such as faults and nappe tectonics, are described as much as possible.

In particular, it is important to describe the relevant situation of the field sampling points, and describe the collected rock samples in detail, such as structure, construction, color of a weathering surface, color of a fresh surface, main mineral components and their approximate content, etc.

Step S4, mineral processing rules are formulated.

After rock samples are collected in the field, the rock samples need to be processed indoors, and monominerals are selected for analysis and testing of thermochronology after steps of sample crushing, monomineral sorting, etc. Due to particularity of thermochronology analysis, special rules and requirements for sorting monominerals are also formulated on the basis of the conventional flow.

1. The first step is to crush samples. It is required to use an uncontaminated equipment and prevent strictly cross-contamination of the samples when crushing the rocks.

2. Upon sorting monominerals of zircon, apatite and sphene, it is required to ensure integrity of a crystal form as much as possible. Time for crushing sample should be short, and crushed samples should be passed through sieve multiple times. The sample is avoided being crushed too fine at one time, which may cause large particles of zircon or apatite to be crushed. The sample can not be heated and baked at high-temperature! (The heating temperature of the sample shall not exceed 45° C.! It is preferable to dry naturally). In principle, more than 1000 grains should be selected for each monomineral.

3. Upon sorting silicate minerals such as hornblende, biotite, potassium feldspar, plagioclase and sanidine, organic pollution is strictly prohibited in sorting process, where the particle size is required to be 60 to 80 meshes, the purity is required to be above 99%, and in principle, the weight of each monomineral sorted is required to be above 3 grams.

Step S5: Target minerals selected at each of the field work points are analyzed by using a thermochronology research method to obtain basic analysis data.

The basic analysis data needed for the research of denudation depth thematic mapping mainly includes thermochronology analysis and testing data, followed by composition analysis data. After obtaining various monominerals analysis and testing targets in Step S4, high-quality laboratories are selected to carry out relevant analysis and testing.

1. Zircon and apatite (U—Th)/He dating analysis. Laser heating is used to extract He, and a chemical dissolution method is used to extract U and Th to perform zircon and apatite single-grain mineral (U—Th)/He dating analysis on the research samples. 3 to 5 grains are analyzed in each zircon sample, and 5 grains are analyzed in each apatite sample.

2. Apatite fission track (FT) dating analysis. Fission track dating is performed on apatite samples. An Inductively Coupled Plasma-Mass Spectrometry (ICP-MS) method is the preferred analysis method, followed by a traditional external detector method. The traditional external detector method analyzes not less than 30 grains per sample, and the Laser Ablation-Inductively Coupled Plasma-Mass Spectrometry (LA-ICP-MS) method analyzes not less than 40 points per sample.

3. Potassium-containing silicate mineral Ar—Ar dating analysis. Ar—Ar dating analysis is performed on potassium-containing silicate minerals such as amphibole, biotite, muscovite, potassium feldspar, and plagioclase sorted from the research samples using the stepwise heating technique, and age spectrum and isochron are acquired.

4. Zircon U—Pb dating analysis. An LA-ICPMS technology is used to perform zircon U—Pb dating analysis on the research samples. 200 grains of each sample are carefully selected for preparing target, and a zircon monomineral is polished to $1/3$–$1/2$; cathode luminescence photos, transmitted and reflected light photos are captured; parts with clear annule zones are selected for zircon dating analysis. The effective dating analysis points of each sample shall be no less than 20. The analysis contents include isotope ratios and ages of $^{207}Pb/^{206}Pb$, $^{207}Pb/^{235}U$, $^{206}Pb/^{238}U$, $^{208}Pb/^{232}Th$, and content of elements such as SiO2, Ti, Y, La, Ce, Pr, Nd, Sm, Eu, Gd, Tb, Dy, Ho, Er, Tm, Yb, Lu, Pb, Th, and U.

5. Whole rock composition analysis. The whole rock samples crushed to 200 mesh are subjected to major and trace element analysis, and isotope analysis such as Sr and Nd to obtain the chemical composition and isotope data of the research samples.

Step S6: the basic analysis data is input into an improved Low-T Thermo software (whose version number is V5.0) to perform thermal evolution history modeling and denudation depth calculation, so as to obtain the denudation depth at each of the field work points; where the improved Low-T Thermo software adds Ar—Ar dating results of potassium feldspar, plagioclase and amphibole as modeling parameters on the old-version Low-T Thermo software. Such improved software is commercially available under the tradename of "Low-T Thermo" and can be downloaded from https://gs.sysu.edu.cn/teacher/DingRuxin, and has been developed, using Mathematica and VB.net based on an older version of Low-T Thermo software by associate professor Ding Ruxin of Sun Yat-sen University. The improved Low-T Thermo software was publicly available as of Sep. 10, 2022.

Taking Low-Temperature Thermochronology (Low-T Thermo) software as an example, the process of thermal history modeling and denudation calculation is introduced.

The main functions and uses of the "Low-T Thermo" thermochronology modeling software are as follows: (1) low-temperature chronology thermal history modeling (including (U—Th)/He of apatite and zircon, fission tracks of apatite and zircon, mica Ar—Ar, potassium feldspar Ar—Ar, plagioclase Ar—Ar, amphibole Ar—Ar, bedrock quartz optically stimulated luminescence, vitrinite reflectance, and combinations of these methods) are suitable for thermal history restoration of orogenic belts and basins; (2) the time-phased quantitative denudation amount calculation based on thermal history is suitable for researches, such as denudation depth of the geological body and mineral deposit preservation conditions, etc.; (3) the paleotopography modeling based on thermal history is suitable for research of paleogeomorphology restoration.

In the initial version of this software, only the Ar—Ar dating results of biotite are used in the Ar—Ar thermochronology method of a thermal history modeling. However, due to the Ar isotope closure temperature range of biotite of 310-345° C., and a significant difference between the Ar isotope closure temperature range of biotite and the U—Pb closure temperature of zircon (800° C.), it is easy to result in distortion of thermal history modeling in the high temperature range. At the same time, there is a big temperature difference between the Ar isotope closure temperature of biotite and the He closure temperature of zircon (200° C.), which easily results in distortion of thermal history modeling in the middle temperature range. So the software is modified, and the Ar—Ar dating results of potassium feldspar, plagioclase and amphibole are added as modeling parameters, which further improves the modeling precision of thermal history in the middle and high temperature range and may obtain more accurate numerical values of denudation depth.

In the improved software, there are nine different thermochronology methods used for thermal history modeling. These nine methods can be selected arbitrarily, including selecting single or a plurality of the methods. Theoretically, there are 255 combination modes, including selecting a single method.

(A) Installation

Low-T Thermo is developed by Mathematica and VB.net under Microsoft Windows operating system. Therefore, Mathematica 10.0 needs to be installed before the Low-T Thermo usage, and Wolfram.NETLink.dll should be copied to the directory where the main program Low.exe is located. In addition, Microsoft. NETFramework version 2.0 or above is required.

(B) Program Interface and Usage Overview

Figure 2:
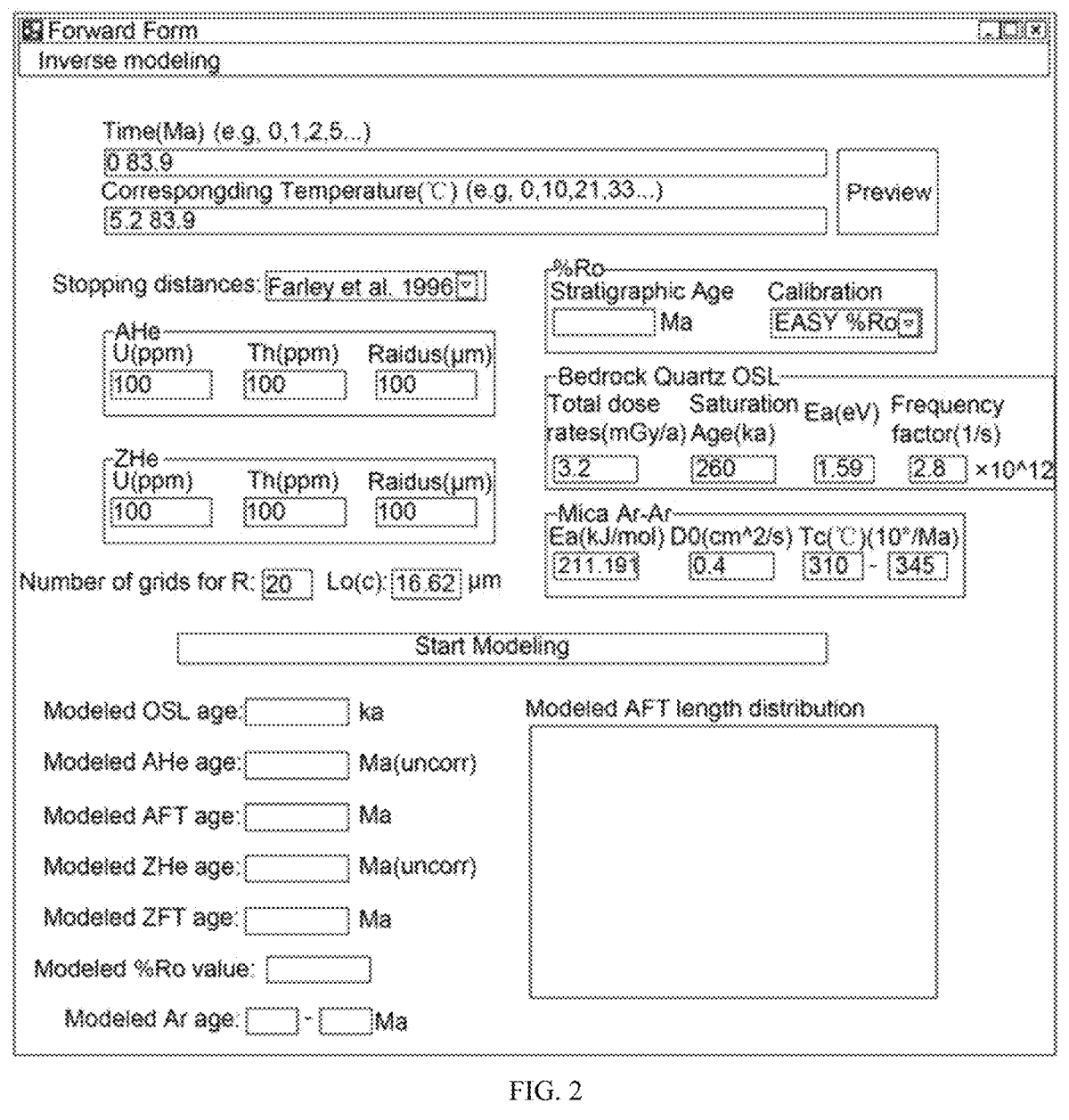

1. Thermal history Forward Modeling Window is Shown in FIG. 2.

After inputting Time (Ma) (time), corresponding Temperature (° C.) (temperature) and other parameters, the "StartModeling" (start modeling) button is pressed, and the distribution results of the age and length corresponding to the input thermal history curve will be output.

Figure 3:
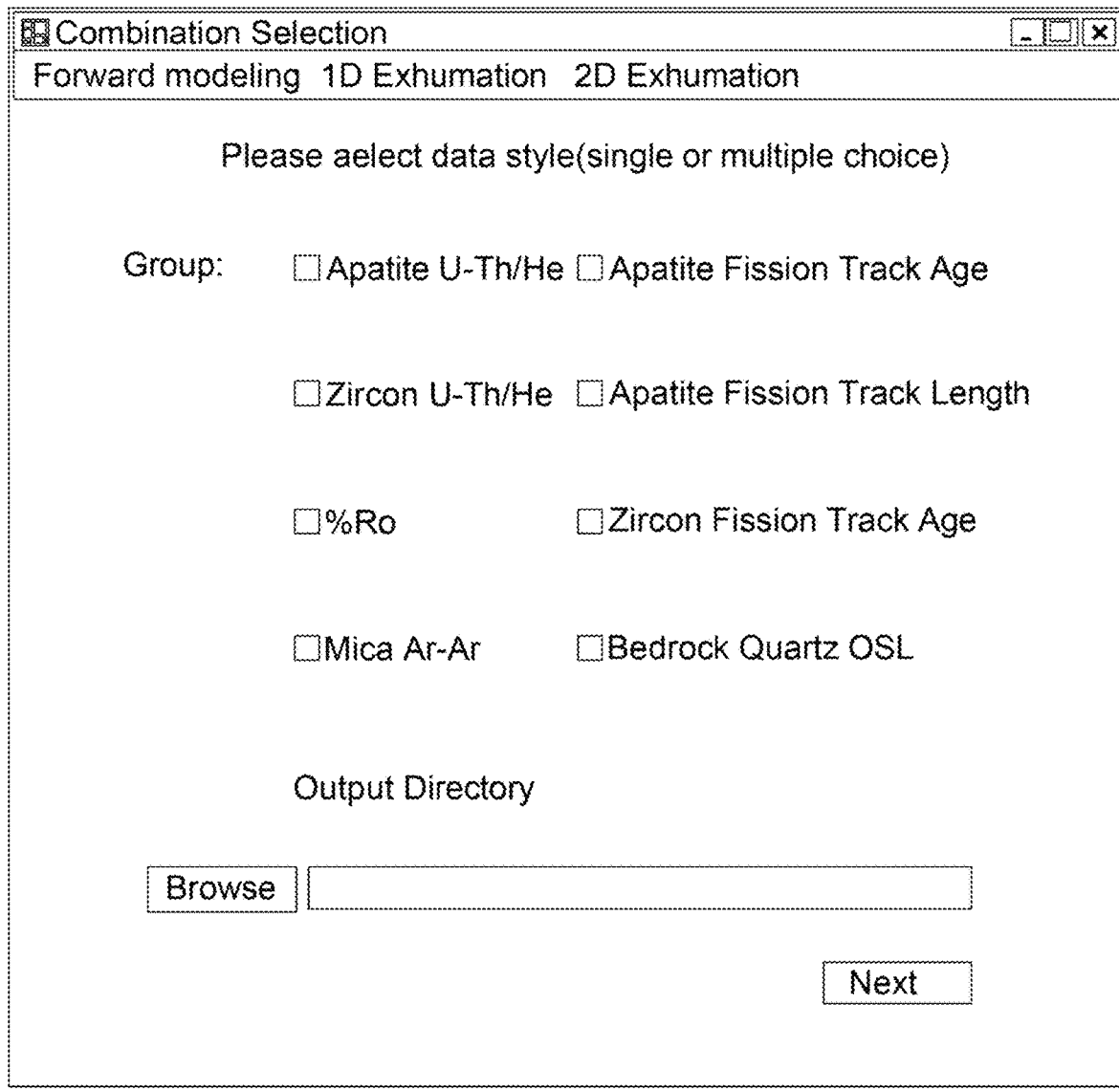
FIG. 3 is a schematic diagram of a thermochronology method selection window according to an embodiment of the present disclosure.

2. Thermochronology Method Selection Window is Shown in FIG. 3.

In this window, there are nine different thermochronology methods used for thermal history modeling. These nine methods can be selected arbitrarily, including selecting single or a plurality of the methods. Theoretically, there are 255 combination modes, including selecting a single method. The output directory is used to store all calculated and exported data and graphics files.

Figure 4:
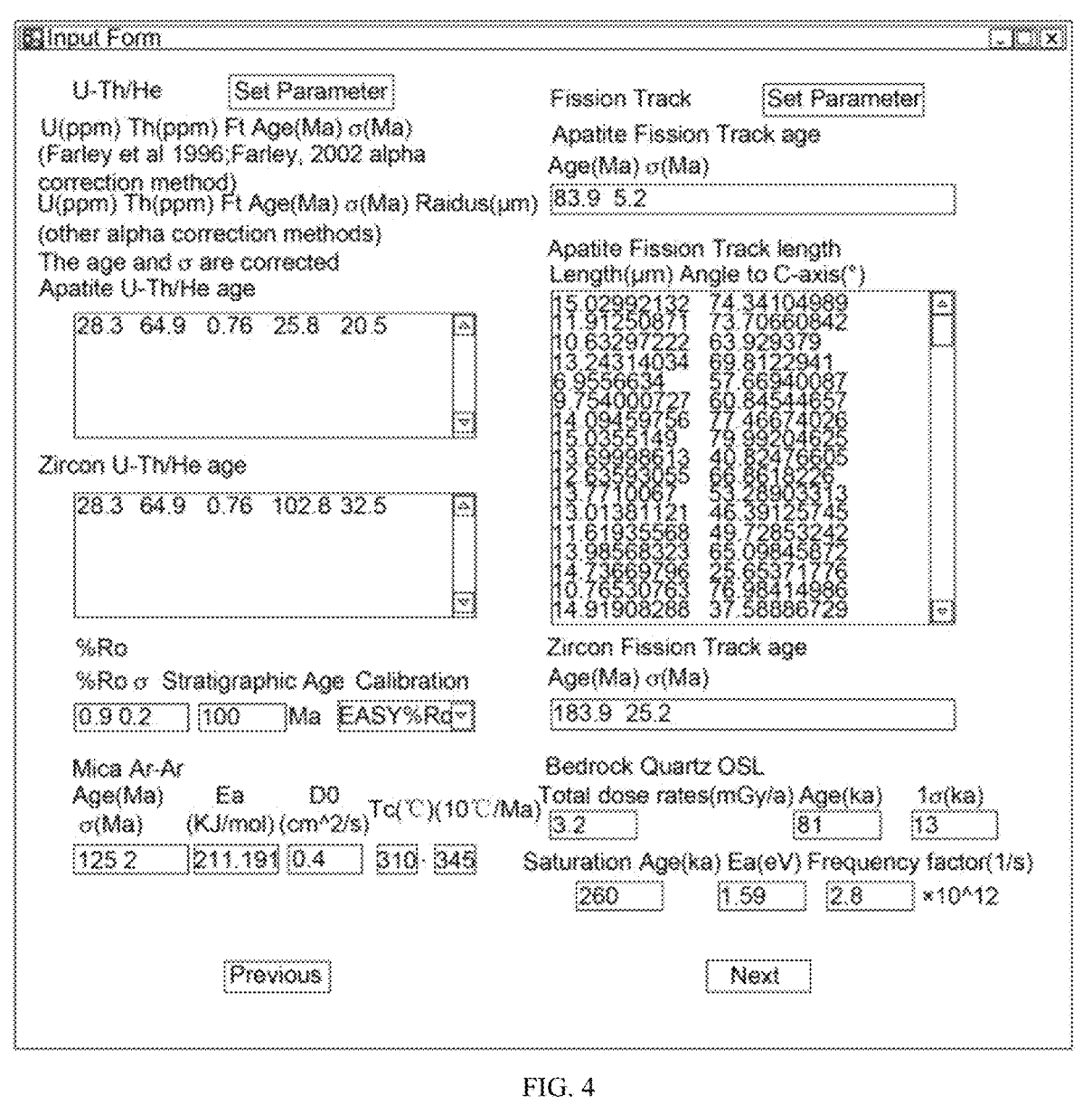

3. Input Window is Shown in FIG. 4.

After selecting different thermochronology methods, "Next" (next step) is clicked to enter the input window, and the corresponding experimental data and parameters are input. Each data input box is equivalent to a notepad, and the data can be edited arbitrarily. This is conducive to copying and pasting data from other software, and the data can be further edited as needed. The specific input format can refer to the existing data format examples, and sample data can be replaced when inputting. Enter can be pressed for line feed when inputting multiple lines. The space between data can be one space or multiple spaces, or even the Tab key can be pressed as a space.

Figure 5:
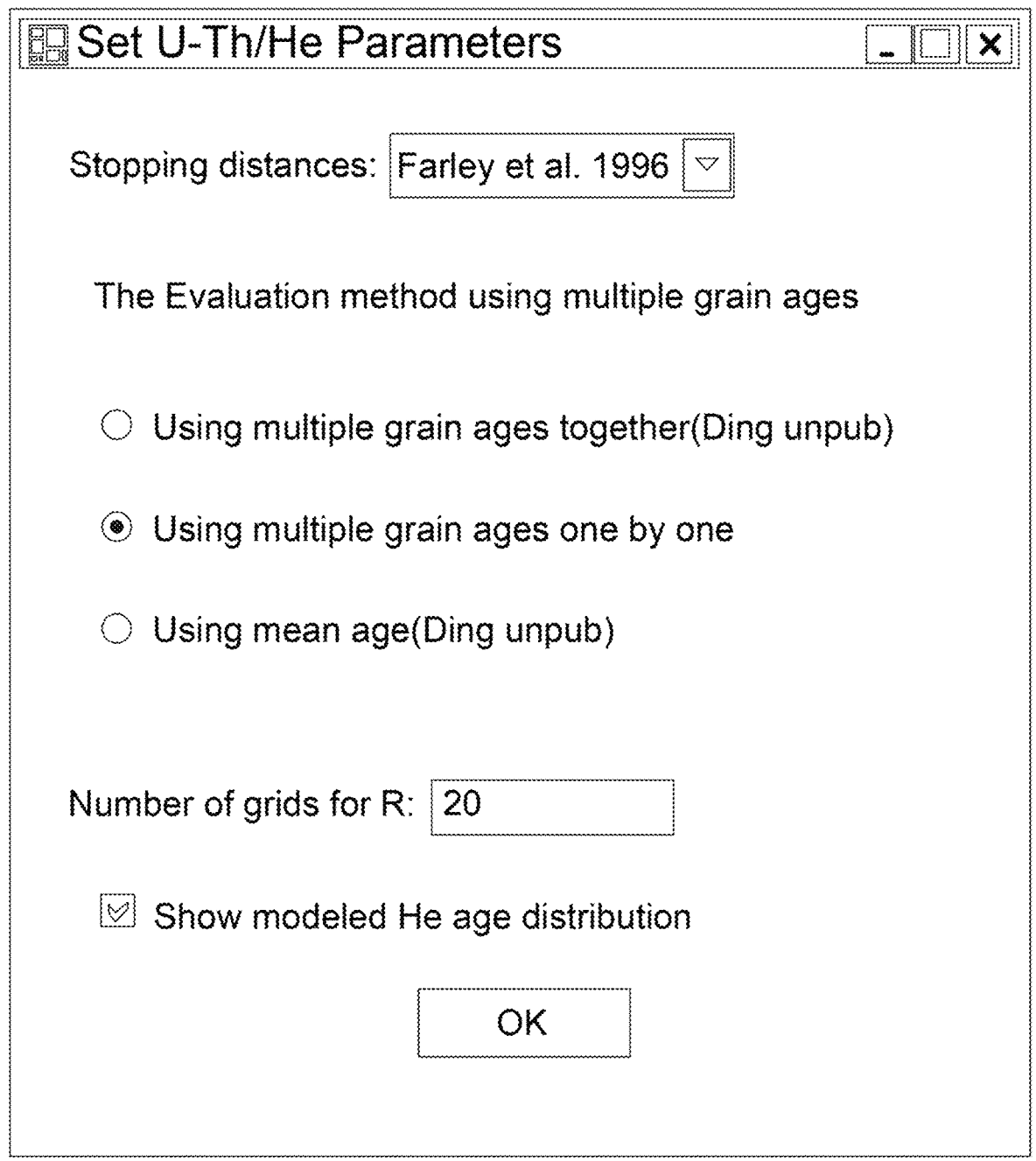
FIG. 5 is a schematic diagram of a U—Th/He parameter setting window according to an embodiment of the present disclosure.

For (U—Th)/He method, stopping distance of α particles can be selected from mode of Farley et al. in 1996 or Ketcham, et al. in 2011. For multiple—grains, "Using multiple grain ages one by one" can be selected, which is used to screen hypothetical paths one by one for each particle; "Using multiple ages together" modeling can also be selected, which is used to screen the hypothetical path uniformly for each particle and finally take the average acceptable goodness of fit (GOF) range. "Using mean age" is used to select the average age of all grains and then screen the hypothetical path, as shown in FIG. 5.

"Number of grids for R" is used to set the number of finite difference nodes. The default value is 20, and the maximum value can be set to 100. The larger the value, the denser the grid, the higher the precision, but the slower the calculation. This value has limited influence on the calculation results of the (U—Th)/He modeling age, and the value is usually set to 20, which can satisfy most requirements.

"Show modeled He age distribution" is used to set whether to display the distribution diagram of He particle age against available uranium concentration.

Figure 6:
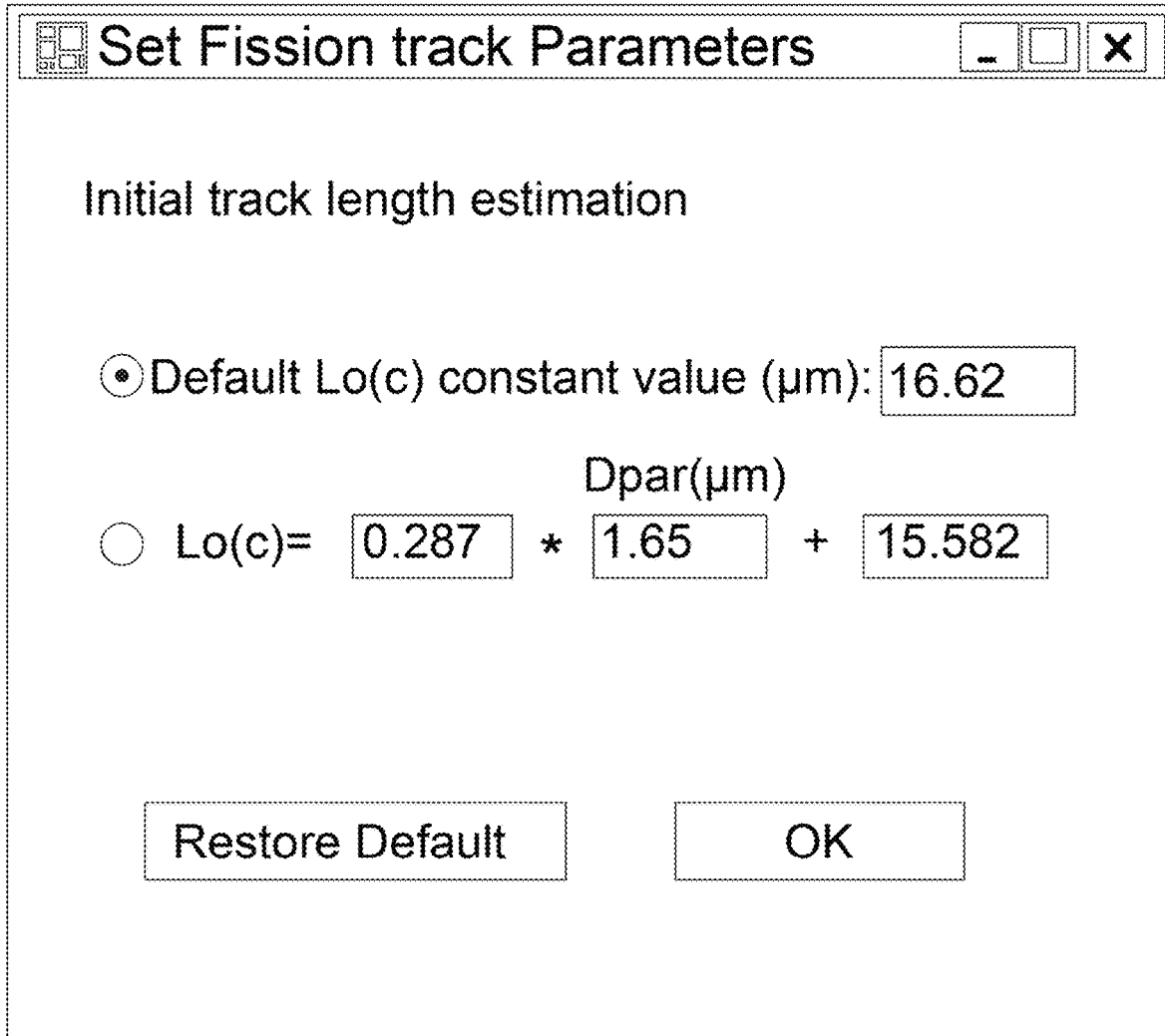
FIG. 6 is a schematic diagram of the fission track parameter setting window according to an embodiment of the present disclosure.

For the fission track method, "Default Lo (c) constant value (μm)" is the default Lo (c) (the initial confined track length after projection correction). "Lo (c)=" is used to set the Lo (c) value through Dpar (μm). "Restore Default" is to restore the default setting, as shown in FIG. 6.

For vitrinite reflectance % Ro, the calibration mode includes EASY % Ro (Sweeney and Burnham, 1990), IKU % Ro (Ritter et al., 1996) and basin % Ro (Nielsen et al., 2016).

Figure 7:
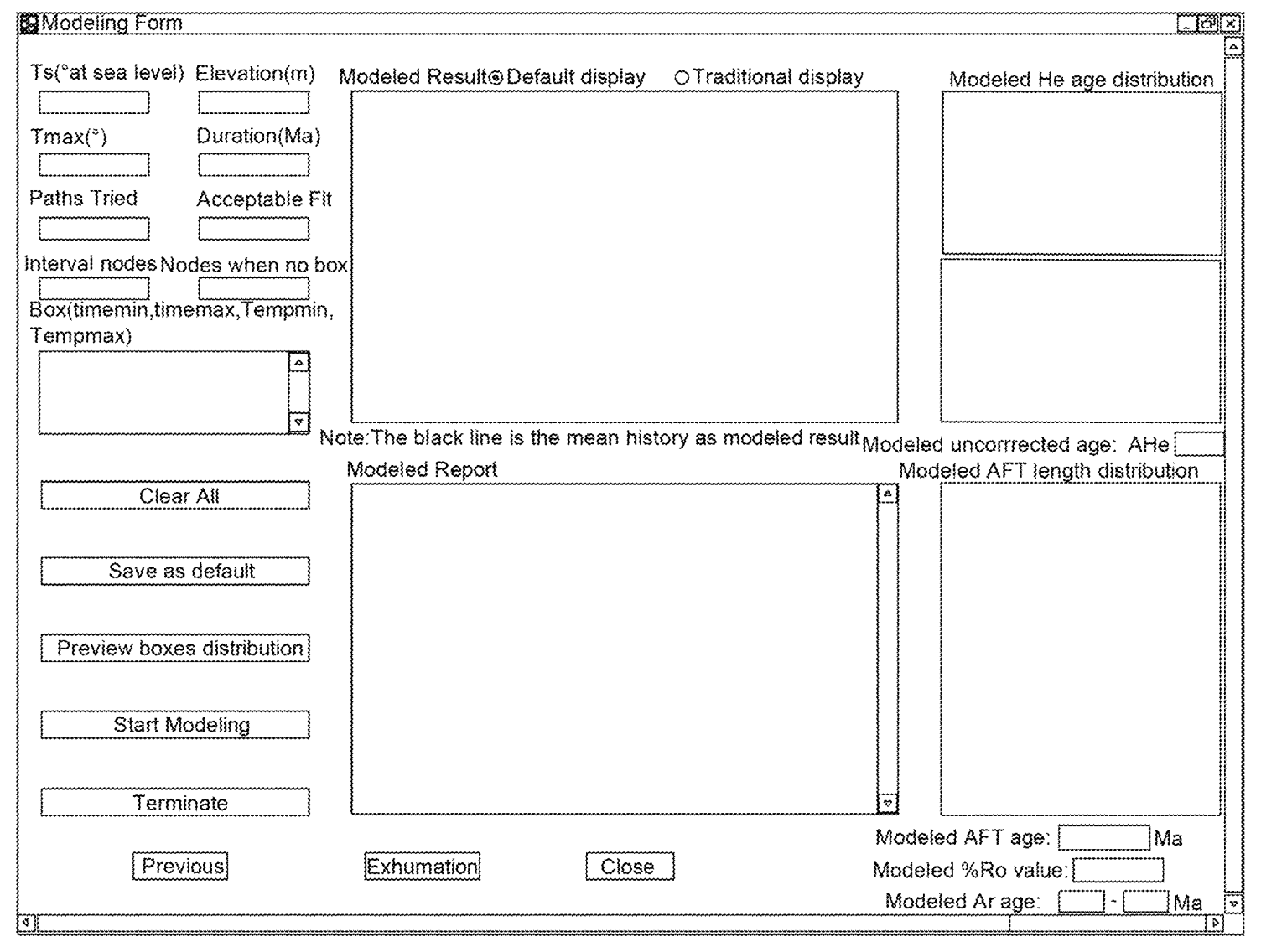

4. The Main Window (Thermal History Inversion Modeling Window) is Shown in FIG. 7.

"Ts (° C., at sea level)" is the surface temperature at sea level height (unit: Celsius).

"Elevation (m)" is the height where the sample is located. The atmospheric vertical temperature gradient is 6° C./km by default.

"Tmax (° C.)" is the maximum ordinate value. As the ordinate in the output thermal history modeling map is temperature, it needs to set the display range of the coordinate axis.

"Duration (Ma)" is the maximum abscissa value. As the abscissa in the output thermal history modeling map is time, it needs to set the display range of the coordinate axes.

"Paths Tried" is the number of thermal history paths searched in the inversion process, which is usually 10,000 (it can be customized according to actual needs).

"Acceptable Fit" is the acceptable goodness of fit (GOF), which is usually 0.05. The GOF can be set according to actual needs.

"Interval nodes" is interval nodes. When there is background information such as actual geological conditions, the number of nodes between every two adjacent constraint boxes is given by the user, for example, 3.

"Nodes when no box" is the number of nodes in each random path (for example, 10) when there is no constraint box.

"Box (timemin, timemax, TTempmin, Tempmax)" is a box where time and temperature range of the constraint box is input if there is a constraint box. The minimum time value of "timemin", the maximum time value of "timemax", the minimum temperature value of "Tempmin" and the maximum temperature value of "Tempmax" are input in sequence. Each constraint box occupies one line. Press Enter for line feed when inputting multiple lines.

The "ClearAll" button is used to clear all the above parameter inputs.

The "Save as default" button is used to save all the above parameter inputs as the default input for the next modeling.

"Preview boxes distribution" is used to preview constraint box.

"Start Modeling" is a starting inversion modeling button.

"Terminate" is a terminating inversion modeling button. When there is an error in operation or there is no time to wait for the program to operate, press this key to stop inversion and terminate the modeling.

"Modeled Result" is a box used to display the thermal history modeling results.

"Default display" is used to display a default style. When selecting this option, all acceptable paths are displayed. The black line is the average result of all acceptable paths.

"Traditional display" is used to display a traditional style. Upon selecting this option only the boundaries of all acceptable paths are displayed, similar to the display styles of AFTSolve (Ketchum et al., 2000) and HeFTy (Ketchum, 2005). The traditional display result will consist of two ranges: acceptable range (GOF≥Acceptable Fit) and high-precision range (GOF≥0.5). If there is a high-precision range, a black line represents the average result of all paths within the high-precision range, otherwise the black line represents the average result of all acceptable paths.

"Modeled He age distribution" is used to show distribution of He age against available uranium concentration. The RDAAM (radiation damage accumulation and annealing model) (Flowers et al., 2009) is used for the radiation damage accumulation and annealing model of apatite, and ZrRDAAM (zircon radiation damage accumulation and annealing model) (Guenthner et al., 2013) is used for the radiation damage accumulation and annealing model of zircon.

"Modeled AFT length distribution" is used to show a length distribution of the confined track of the apatite fission track.

The text box in the right column is used to display the age values corresponding to the thermal history modeling results (i.e., black lines) of selected different thermochronology methods.

"Modeled Report" is used to display the detailed calculation process and report relevant information. When "The end" or "No Result" appears, it means that the modeling is over.

After the thermal history modeling is completed, the graphics will eventually be output in the format of ".pdf" and saved in the output directory set by the user at the beginning for subsequent editing of the user.

Figure 8:
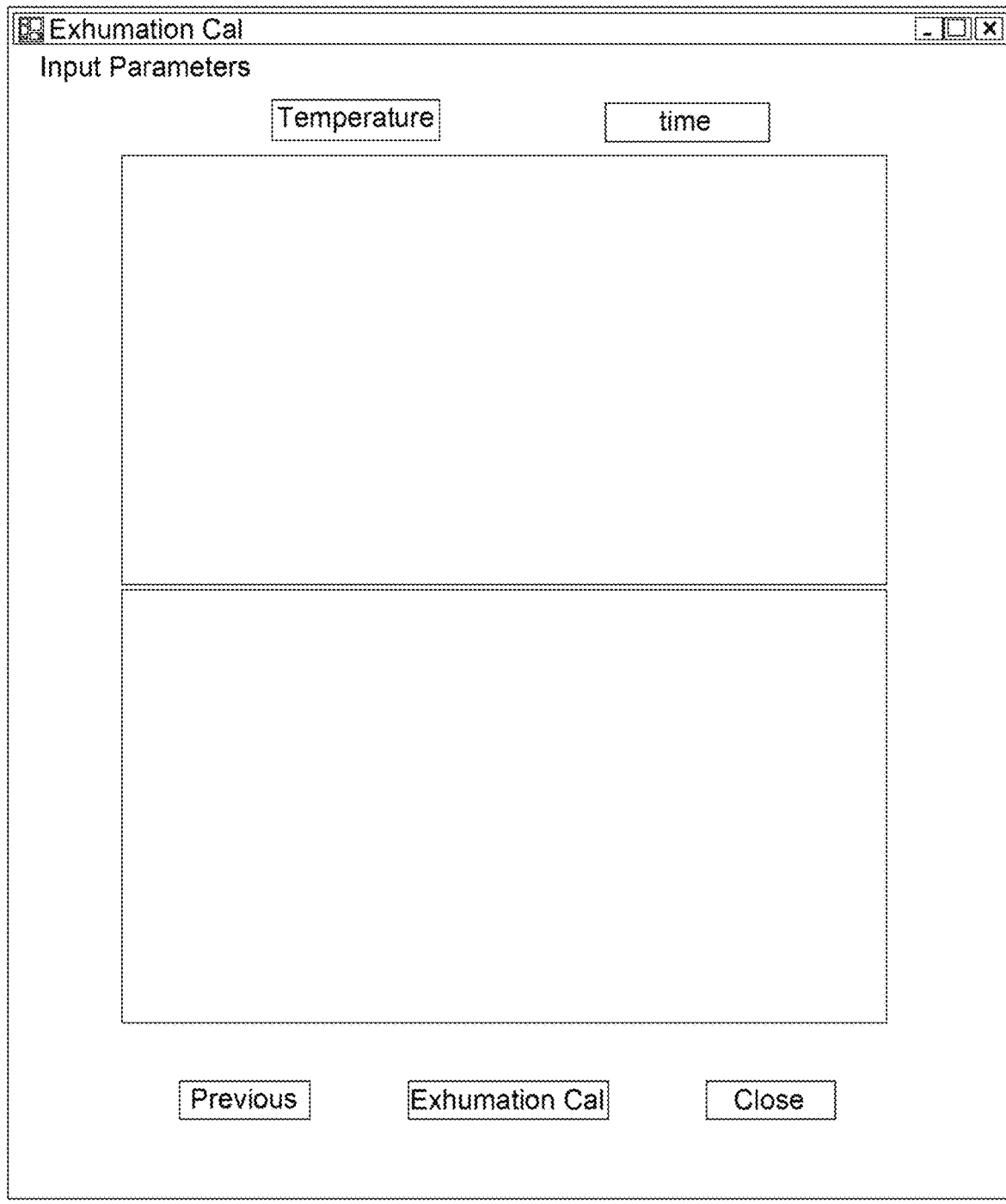
FIG. 8 is a schematic diagram of a one-dimensional denudation calculation window according to an embodiment of the present disclosure.

5. A One-Dimensional Denudation Calculation Window is Shown in FIG. 8.

The "Temperature" button is used to select the temperature data of a thermal history curve.

The "time" button is used to select the time data of a thermal history curve.

The "Exhumation Cal" button is used to convert the thermal history curve from a temperature-time curve to a denudation thickness-time curve.

"Ts (at sea level)" and "Elevation (m)" are the same as described above.

"Temperature Gradient" is a geothermal gradient.

"Turning Range" is selection range of an inflection points in a high temperature section. "Turning Range" is used to correct the starting point where the thermal history extends from the low temperature section to the high temperature section (i.e. the inflection point interval between the low and high temperature section). If it is null, the program will search for the inflection point with the largest angle in the whole time period. If the user inputs a rough time range, the searched inflection point position of the low-temperature section and the high-temperature section will be closer to the actual geological situations.

Figure 9:
FIG. 9 is a schematic diagram of a one-dimensional denudation calculation parameter input window according to an embodiment of the present disclosure.

"Output interval" is time interval for outputting calculation results. For example, if 1 is inputted, it means that a piece of denudation thickness data is extracted every 1 Ma (Ma=megaannus=million years), as shown in FIG. 9.

Figure 10:
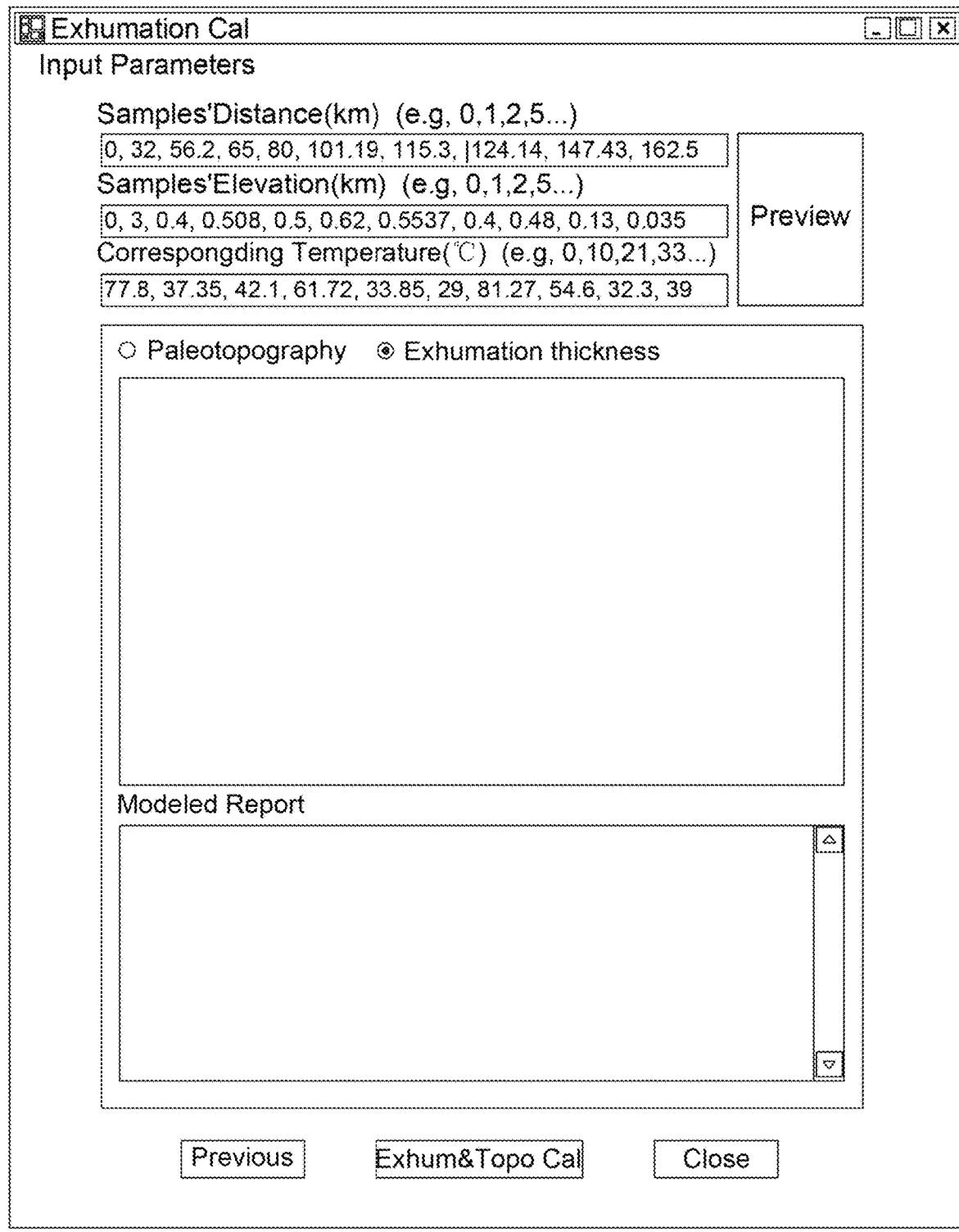
FIG. 10 is a schematic diagram of a two-dimensional denudation and paleotopography modeling window according to an embodiment of the present disclosure.

6. A Two-Dimensional Denudation and Paleotopography Modeling Window is Shown in FIG. 10.

"Samples'Distance (km)" is a distance between input samples.

"Samples'Elevation (km)" is an elevation of an input sample.

"Correlating temperature (° C.)" is a paleotemperature of the input sample.

"Paleotopography" is used to display the modeling results of two-dimensional paleotopography, and the "Exhumation thickness" window is used to display the modeling results of the denudation thickness, as shown in FIG. 11.

The listed parameters are sea level surface temperature, atmospheric vertical geothermal gradient, base temperature, base depth, topographic wavelength, effective elastic-thickness, Young's modulus, Poisson's ratio, mantle density, crustal density, thermal diffusion coefficient, gravitational acceleration, time node, initial search height difference (>0) and initial search wavelength index. The parameters can be customized with reference to the program default values.

Figure 12:
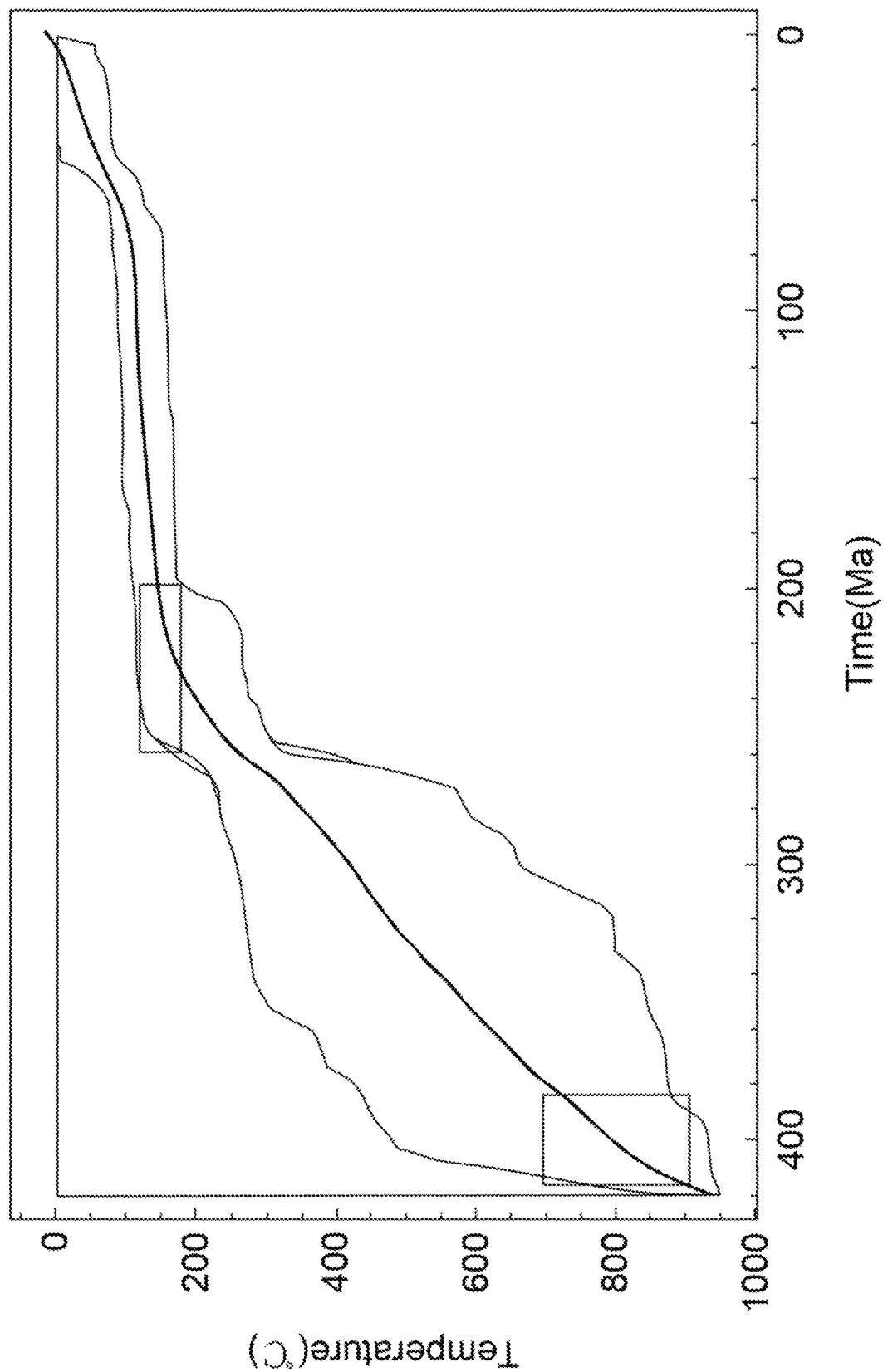
FIG. 12 is a graph of thermal evolution history according to an embodiment of the present disclosure (traditional style display).
Figure 13:
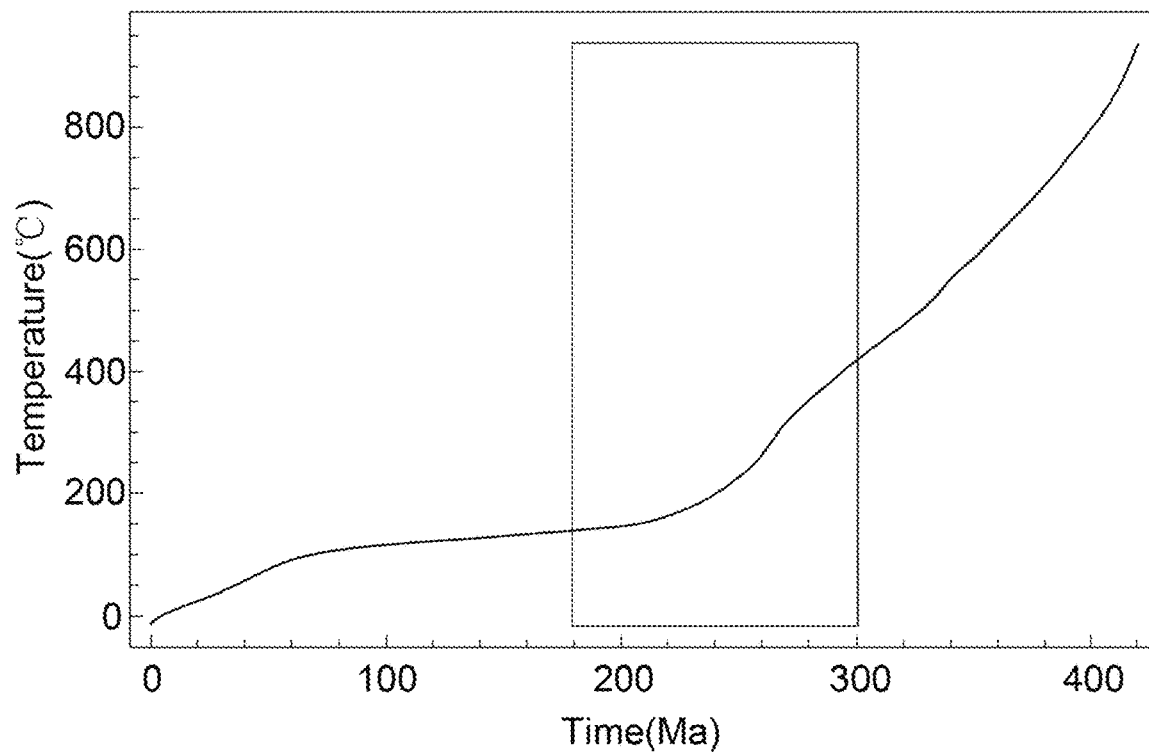
FIG. 13 is a graph of reversely displaying thermal evolution history according to an embodiment of the present disclosure.
Figure 14:
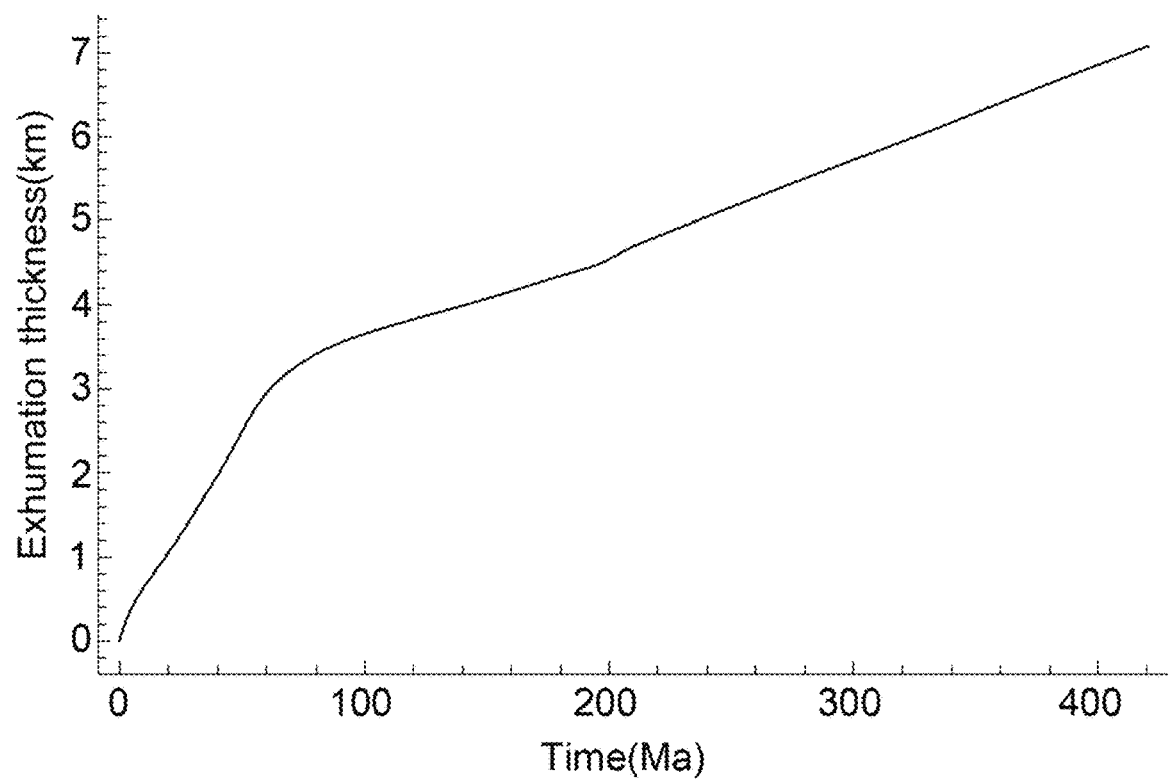
FIG. 14 is a graph showing calculation results of a denudation depth (a denudation amount) according to an embodiment of the present disclosure.

All graphics and related data appearing in the main modeling window are automatically output to the output directory. These graphics (FIG. 12 to FIG. 14) are saved as PDF files and can be re-edited in various vector editing software, such as AdobeIllustrator and CorelDRAW, etc.

Step S7: a denudation depth isopleth map of the research area is drawn according to the denudation depth at each of the field work points; and the 1:50,000 or 1:200,000 standard regional geological map of the research area is used as a base map, the base map and the denudation depth isopleth map are superimposed to obtain a denudation depth map of the research area.

After obtaining the denudation depth (denudation amount) data of a plurality of geological observation points, using the 1:50,000 or 1:200,000 standard regional geological map as the base map, using MAPGIS software to draw the map, using the isopleth map to indicate the change of the denudation depth in the research area, using "Kring Pan Kriging method gridding" as a gridding calculation method, the specific process is described as follows.

Data preparation. The point information and denudation amount information of corresponding sampling points are imported into the TXT file.

Discrete data gridding. The "Digital Terrain Model (DTM) analysis" program in the "Spatial Analysis" of the MAPGIS software is applied to the gridding operation. Firstly, the "discrete data gridding" is selected to process the above TXT file. Secondly, the corresponding grid parameters (grid interval, etc.) are set, such as a gridding method. "Kring Pan Kriging method gridding" is used in this modeling.

Plane isopleth drawing. Firstly, delaunay triangulated graph file is opened, and the "plane isopleth drawing" function is selected. Secondly, the drawing parameters of the plane isopleth map are set, such as isopleth segmentation parameters, smoothness and so on. Thirdly, a plane isopleth map is drawn.

A standard regional geological map of the 1:50,000 or 1:200,000 is vectorized and used as the base map. Firstly, the "image analysis" function in "image processing" in MAPGIS is used to convert the 1:50,000 geological base map into a file type loaded by the MAPGIS software. Secondly, the above files are vectorized, that is, establishing a corresponding point, wire and surface files. Thirdly, the geological map of the corresponding structural position and the regional granite distribution map are vectorized, and are merged into a 1:50,000 geological vector file.

The denudation isopleth map is imported. The established plane isopleth map is imported into the corresponding geological base map library file for optimization (such as whether the points are covered, etc.).

Graphic elements are perfected. Graphic elements such as graphic scale, compass, legends and sheet index are added outside drawing frame; a description of the map is added; style and color of the map are further adjusted, details of the map are typeset and decorated, and the visualization effect of the map is improved.

Map output. A mapgif map output function is used to output picture format files.

In this embodiment, the 1:50,000 and 1:200,000 large-scale denudation depth mapping equipped with the standardized geological base map has not been carried out, no matter at home or abroad, and there is no corresponding mapping specification. This method explores and systematically establishes the 1:50,000 and 1:200,000 denudation depth mapping specification of the regional geological body, which is innovative as a whole and has many highlights and advantages.

1. The rule for arranging field work point and field work route of denudation depth mapping is created (corresponding to Step S1). In the field research point arrangement and route selection, the gridding rule of fixed values used in traditional regional geological mapping is broken. According to the research purpose in conjunction with the actual regional geological situation, the field investigation routes and observation research point are selected. In view of the fact that in the thermochronology research, due to linkage and consistency of related "events" within a certain area, it is not necessary to emphasize the compulsion of the investigation routes and the density of the field observation research points. However, it needs to note that there is point distribution in different parts of the map (center, four corners). The main consideration of the field work route and field work point arrangement of denudation depth thematic mapping is representativeness, followed by uniformity of point distribution, and finally density of points. Based on this, the determined principle of field work route and point arrangement of the denudation depth mapping is as follows: comprehensively considering the thermochronology analysis precision, lithology distribution and point uniformity to set points; setting route according to the point distribution.

2. The sampling rules of denudation depth mapping are created (corresponding to Step S2). For intrusive rocks with different occurrences, sampling rules such as "stock-like rock mass", "plane rock mass" and "three-dimensional rock mass" are established. For important fault zones in the region (penetrating through the region, or important structural boundaries, or differences in rock lithology ages on both sides), control points are set at the center and both ends along the fault zone, and thermochronology research samples are collected at both sides of fracture at the control point, respectively. For the shear zone, three control points are set at the center and both ends (or both sides) along the shear zone, and at least one thermochronology research sample is collected on each shear zone, so as to collect strongly deformed rock samples. For metamorphic strata, such as Proterozoic old basement rocks and other metamorphic rocks, thermochronology research samples are collected with reference to the intrusive rock sampling rules. For sandstone and epimetamorphic rocks in sedimentary strata, routes and points are greatly sparse on the basis of 1:50,000/1:200,000/1:250,000 regional geological mapping specifications, and thermochronology research samples are collected if necessary. The continuous thermochronology sections are set; one or two sections with large elevation difference are selected in the picture frame, and thermochronology research samples are collected according to a certain elevation difference (300 to 400 meters). It is noted that the sampling density can be appropriately increased at the low elevation end and the high elevation end of the section to produce thermochronology sections. Suggestions on reasonable sampling amount are given for rocks with different lithology.

3. The field observation and recording rules suitable for thermochronology research is established (corresponding to "Step S3"); the recording content of traditional regional mapping is simplified, contents of sample description and field photography record of sampling points, etc., are especially added.

4. The mineral processing rules are formulated (corresponding to "Step S4"). After the rock samples are collected in the field, the next important work is to sort monominerals for thermochronology analysis and testing. Due to particularity of thermochronology analysis, there are also special requirements for sorting monominerals. On the basis of the regular process, the mineral processing specifications for zircon, apatite, sphene and other minerals have been specially formulated, which includes ensuring an integrity of crystal form as much as possible, crushing sample for a short time, and passing crushed samples through sieve for multiple times, so as to avoid crushing too fine at one time, which may cause large particles of zircon or apatite to be crushed. The samples cannot be heated and baked at high-temperature! (The heating temperature of the sample shall not exceed 45° C.! It is preferable to dry naturally).

5. For different thermal evolution temperature stages experienced by rocks, the basic data are acquired by using a thermochronology research method corresponding to the temperature range (corresponding to Step S5): (1) in magmatism action stage and the high-temperature cooling stage of the rock mass (the high-temperature evolution process of magmatism crystallization-emplacement-in-situ cooling, etc.), the high-temperature thermochronology method such as zircon U—Pb isotope dating, hornblende and sanidine Ar—Ar dating is used for research; (2) for uplift and denudation process of the rock mass, the middle-low-temperature thermochronology method such as Ar—Ar dating of biotite, muscovite, plagioclase and low activation energy potassium feldspar, fission track dating of zircon and apatite, and (U—Th)/He dating is mainly used.

6. Low-Temperature Thermochronology (Low-T Thermo) software is used for thermal history modeling and denudation amount calculation (corresponding to Step S6).

In the research of thermal history modeling, The "Low-T Thermo" thermochronology modeling software is used, which has following main functions and uses. (1) Multi-method low-temperature chronology thermal history modeling includes (U—Th)/He of apatite and zircon, fission tracks of apatite and zircon, mica Ar—Ar, hornblende Ar—Ar, bedrock quartz optically stimulated luminescence, vitrinite reflectance, and combinations of these methods, which can be used in the low-temperature thermal history modeling. There are nine different thermochronology methods used for thermal history modeling. These nine methods can be selected arbitrary, including selecting single or a plurality of the methods. Theoretically, there are 255 combination modes, which are suitable for thermal history recovery of orogenic belts and basins. (2) The time-phased quantitative denudation amount calculation based on thermal history is suitable researches, such as denudation depth of the geological body and mineral deposit preservation conditions, etc., (3) The paleotopography modeling based on thermal history is suitable for research of paleogeomorphology restoration. (4) The thermal evolution history graph can be displayed in reverse, and the calculation results of the denudation depth (denudation amount) can be directly output, which can be displayed in numbers and figures. In the initial version of this software, only the Ar—Ar dating results of biotite are used in the Ar—Ar thermochronology method of a thermal history modeling. However, due to the Ar isotope closure temperature range of biotite of 310-345° C., and a significant difference between the Ar isotope closure temperature range of biotite and the U—Pb closure temperature of zircon (800° C.), it is easy to result in distortion of thermal history modeling in the high temperature range. At the same time, there is a big temperature difference between the Ar isotope closure temperature range of biotite and the He closure temperature of zircon (200° C.), which easily results in distortion of thermal history modeling in the middle temperature range. So the software is modified, and the Ar—Ar dating results of potassium feldspar, plagioclase and amphibole are added as modeling parameters, which further improves the modeling precision of thermal history in the middle and high temperature range and may help to obtain more accurate numerical values of denudation depth.

7. The finally finished map has many advantages (corresponding to "Step S7"). (1) The standardized regional geological map is vectorized as the geological base map, the plane isopleth map is imported into the corresponding geological base map, and the two maps are superimposed to produce the denudation depth map, so that geological elements, such as distribution and structure of the geologic body, the lithology, etc., in the map produced in this way correspond completely to those in the regional geological map of relevant scale, which is convenient for regional geological research and mineral exploration by using the denudation depth map. (2) The density of points used for finally producing a map is high, and the accuracy of the produced denudation depth map is higher. (3) The scale of the map is large, which can show regional denudation history in detail. (4) The isopleth is used to represent the denudation depth, and users can quickly and conveniently know the denudation degree and the change of the denudation depth in the research area.

In the present disclosure, specific examples are applied to illustrate the principle and implementation of the present disclosure, and the explanations of the above embodiments are only used to help understand the method and core ideas of the present disclosure. At the same time, according to the idea of the present disclosure, there will be some changes in the specific implementation and application scope for those skilled in the art. To sum up, the contents of the specification should not be construed as limiting the present disclosure.

What is claimed is:

1. A large-scale denudation depth thematic mapping method, comprising:
   creating a rule for arranging field work points and a field work route in a research area and creating a sampling rule for sampling at the field work points;
   creating a field observation and recording rule suitable for thermochronology research and formulating a mineral processing rule;
   analyzing target mineral selected at each of the field work points by using a thermochronology research method to obtain basic analysis data;
   inputting the basic analysis data into an improved Low-Temperature Thermochronology (Low-T Thermo) software to perform thermal evolution history modeling and denudation depth calculation, so as to obtain a denudation depth of each of the field work points; wherein the improved Low-T Thermo software is obtained by incorporating Ar-Ar dating results of potassium feldspar, plagioclase and amphibole as modeling parameters on a basis of a traditional Low-T Thermo software;
   drawing a denudation depth isopleth map of the research area according to the denudation depth at each of the field work points; and setting a 1:50,000 or 1:200,000 standard regional geological map of the research area as a base map, superimposing the base map and the denudation depth isopleth map to obtain a denudation depth map of the research area;
   wherein the analyzing target mineral selected at each of the field work points by using a thermochronology research method to obtain basic analysis data comprises:
   performing zircon, apatite (U-Th)/He dating, apatite fission track dating, potassium-containing silicate mineral Ar-Ar dating, zircon U-Pb dating and whole rock composition analysis on the target mineral selected at the field work points to obtain the basic analysis data; wherein the basic analysis data comprises thermal chronological analysis data and composition analysis data of the target mineral at each of the field work points.

2. The method according to claim 1, wherein the creating a rule for arranging field work points and a field work route in a research area comprises:
   setting the field work points according to a thermochronology analysis precision, lithologic distribution characteristics, point representativeness and uniformity; and
   setting the work route according to distribution of the field work points.

3. The method according to claim 2, wherein the creating a sampling rule for sampling at the field work points comprises:
   for a "stock-like rock mass" with an outcropped area of less than 5 $km^2$ in intrusive rocks, collecting one thermochronology research sample according to surface outcrop situation and sampling convenience;
   for a "plane rock mass" with an elevation range less than 400 meters in an outcropped range of the intrusive rocks, when the "plane rock mass" is a convergent rock mass, collecting one or two thermochronology research samples, wherein a sampling position is a center of the rock mass or a highest point of the rock mass outcropping, and an edge of the rock mass or a lowest point of the rock mass outcropping; and when the "plane rock mass" is a strip rock mass, collecting one to three thermochronology research samples, and sampling positions are center and both ends of the rock mass;
   for a "three-dimensional rock mass" in the intrusive rocks, collecting a series of thermochronology research samples according to an elevation difference of 300 to 400 meters, and increasing a sampling density at both ends of the rock mass; wherein the elevation range of the "three-dimensional rock mass" within the outcropped range of the rock mass is more than 400 meters;
   for a fault zone, setting control points at a center and both ends of the fault zone along the fault zone, and collecting thermochronology research samples at both sides of the fault zone of the control points, respectively;
   for a shear zone, setting three control points at a center and both ends of the shear zone along the shear zone, and collecting at least one thermochronology research sample on the shear zone;
   for metamorphic strata, collecting a thermochronology research sample according to outcropping of the metamorphic strata and in accordance with an intrusive rock sampling rule;
   for sandstones and epimetamorphic rocks in sedimentary strata, collecting a lithologic control sample, or collecting thermochronology research sample according to lithology and outcropping situation and with reference to the intrusive rock sampling rule;
   for continuous thermochronology sections, selecting one or two sections with an elevation difference larger than 1000m inside a map sheet range, and collecting thermochronology research samples according to a predetermined elevation difference to form thermochronology sections.

4. The method according to claim 1, wherein the creating a field observation and recording rule suitable for thermochronology research comprises:
   dividing the field work points into geological control points and geological observation points, and setting a description rule for the geological control points and the geological observation points; and
   setting format and content of a field record book.

5. The method according to claim 1, wherein the formulating a mineral processing rule comprises:
- using an uncontaminated equipment and strictly preventing cross-contamination of samples when crushing a target sample;
- when sorting monominerals of zircon, apatite and sphene, ensuring integrity of a crystal form, crushing the sample and passing crushed sample through a sieve multiple times, wherein a heating and baking temperature of the sample does not exceed 45° C., and more than 1000 grains are selected for each monomineral;
- when sorting silicate minerals, strictly prohibiting organic contamination during the sorting process, wherein particle size is 60 to 80 meshes, purity is above 99%, and each monomineral sorted weights above 3 grams; and the silicate minerals comprise hornblende, biotite, potassium feldspar, plagioclase, and sanidine.

6. The method according to claim 1,
- wherein inputting the basic analysis data at each of the field work points into an improved Low-T Thermo software to perform thermal evolution history modeling and denudation depth calculation, so as to obtain the denudation depth at each of the field work points.

7. The method according to claim 1, wherein the drawing a denudation depth isopleth map of the research area according to the denudation depth at each of the field work points; and setting a 1:50,000 or 1:200,000 standard regional geological map of the research area as a base map, superimposing the base map and the denudation depth isopleth map to obtain a denudation depth map of the research area, comprises:
- creating a plain text (TXT) document based on sample location information and the denudation depth of each of the field work points;
- selecting "discrete data gridding" in Map Geographical Information System (MAPGIS) software to process the TXT document;
- drawing the denudation depth isopleth map by using a "plane isopleth drawing" function in the MAPGIS software according to the processed TXT document;
- vectorizing the 1:50,000 or 1:200,000 standard regional geological map by using an "image analysis" function in the "image processing" in the MAPGIS software so as to generate a vectorized geological map, and setting the vectorized geological map as the base map;
- importing the denudation depth isopleth map into a corresponding area of the base map to obtain the denudation depth map.

8. The method according to claim 1, further comprising determining an underground mineral deposit of the research area based on the denudation depth map of the research area.

* * * * *